United States Patent [19]
Albani et al.

[11] Patent Number: 5,781,417
[45] Date of Patent: Jul. 14, 1998

[54] CIRCUIT BOARD RETAINER

[75] Inventors: David Joseph Albani, Holden; Robert John McCaffrey, Dracut; David Wilfred Tardiff, Tyngsborough, all of Mass.; Yun-Long Tun, Tu-Cheng, Taiwan

[73] Assignee: Digital Equipment Corporation, Maynard, Mass.

[21] Appl. No.: 670,166

[22] Filed: Jun. 27, 1996

[51] Int. Cl.$^6$ ............................................ H05K 7/14
[52] U.S. Cl. .................... 361/801; 361/756; 361/754; 439/157; 439/377
[58] Field of Search .......................... 361/754, 798, 361/756, 801–802, 732, 759; 439/152, 153, 155, 157, 377

[56] References Cited

U.S. PATENT DOCUMENTS

| | | | |
|---|---|---|---|
| 4,994,937 | 2/1991 | Morrison | 361/715 |
| 5,086,372 | 2/1992 | Bennett et al. | 361/686 |
| 5,162,979 | 11/1992 | Anzelone et al. | 361/686 |
| 5,432,682 | 7/1995 | Giehl et al. | 361/796 |

OTHER PUBLICATIONS

Plan View of Compaq Prolinea 4100, at least by May, 1996.
Plan View of Hewlett–Packard Vectra VL Series 3 May 1975, at least by May, 1996.
Plan View of Compaq Prolinea 575, at least by May, 1996.

*Primary Examiner*—Leo P. Picard
*Assistant Examiner*—Anthony Dinkins
*Attorney, Agent, or Firm*—Ronald C. Hudgens; Krishnendu Gupta

[57] ABSTRACT

A circuit board retainer for use within an enclosure for guiding and securing a circuit board within the enclosure includes a guide portion having an upper rail and a lower rail extending along an edge of the circuit board retainer forming a slot therebetween for guiding a side of the circuit board. A latching portion positioned adjacent to the guide portion engages an ejector lever pivotably connected to the circuit board. The ejector lever is capable of locking the circuit board in place relative to the circuit board retainer.

18 Claims, 3 Drawing Sheets

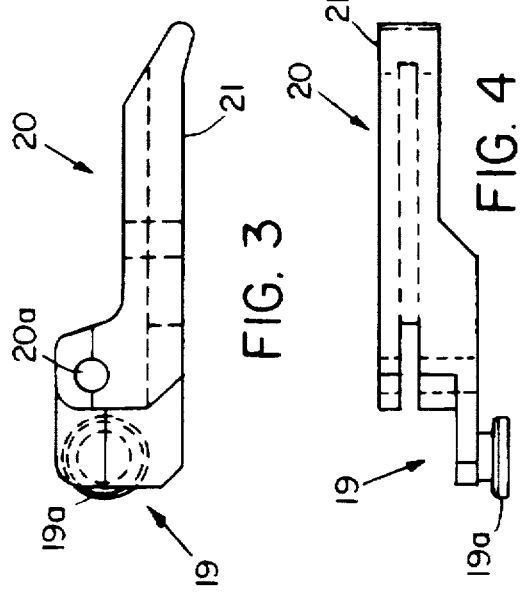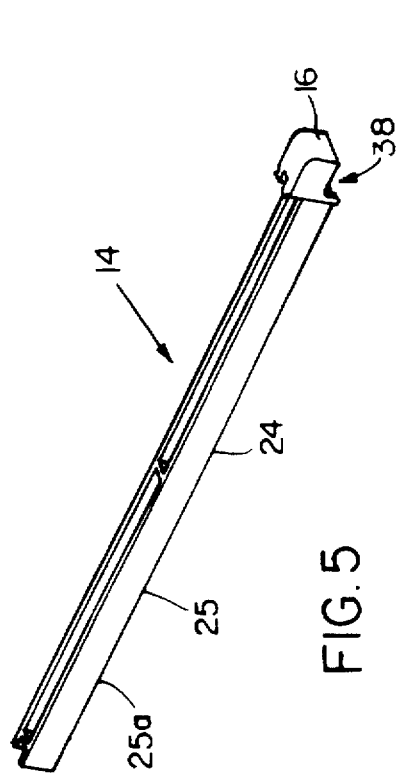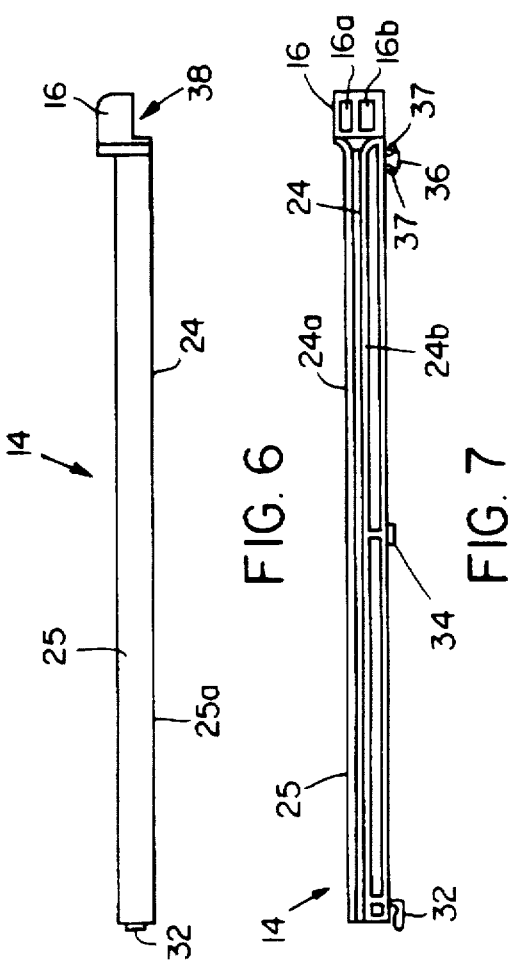

CIRCUIT BOARD RETAINER

BACKGROUND

Personal computers commonly position the system circuit board or motherboard of the computer within the computer enclosure along the bottom wall of the enclosure. Typically, the motherboard extends across the width of the enclosure and is guided on two sides within the enclosure by guides located along opposite walls of the enclosure. This locates the motherboard in proper position to interface with a riser card. The motherboard is locked in place by an ejector lever which is pivotably mounted to the motherboard for engaging a slot in the bottom wall of the enclosure.

SUMMARY OF THE INVENTION

A drawback of this method for guiding and locking a motherboard in an enclosure is that it is not capable of guiding and securing different sized motherboards into the same sized enclosure.

The present invention provides a circuit board retainer for guiding and securing a circuit board including a guide portion having an upper rail and a lower rail extending along an edge of the circuit board retainer to form a slot therebetween for guiding a side of the circuit board. A latching portion is positioned adjacent to the guide portion for engaging an ejector lever pivotably connected to the circuit board. The ejector lever is capable of locking the circuit board in place relative to the circuit board retainer.

In preferred embodiments, the circuit board retainer further includes first and second resilient protrusions extending from the circuit board retainer for engaging respective first and second holes formed in a bottom wall of the enclosure to secure the circuit board retainer to the bottom wall. The first and second holes are included in a first set of holes in the bottom wall of the enclosure. The first and second resilient protrusions are also capable of engaging respective first and second holes of a second set of holes formed in the bottom wall of the enclosure. The second set of holes are spaced apart from the first set of holes so that the position of the circuit board retainer relative to the bottom wall of the enclosure can be adjusted to accommodate different sized circuit boards. The latching portion preferably includes two recesses which are vertically disposed relative to each other and which face in the same direction as the slot for engaging two prongs extending from the ejector lever.

The present invention also provides a system for guiding and securing a circuit board within an enclosure. The system includes a circuit board retainer having a guide portion and a latching portion as previously described wherein the guide portion guides a first side of the circuit board during insertion. A first ejector lever is pivotably connected to the circuit board near the first side of the circuit board for engaging the latching portion of the circuit board retainer. The first ejector lever is capable of locking the first side of the circuit board in place relative to the circuit board retainer. A second ejector lever is pivotably connected to the circuit board near a second side of the circuit board for engaging a slot formed in the enclosure. The second ejector lever is capable of locking the second side of the circuit board in place relative to the enclosure. The first and second ejector levers secure the circuit board within the enclosure.

The present invention provides a circuit board retainer and system for guiding and securing a motherboard within a computer enclosure which allows the same sized enclosure to be used for housing different sized motherboards. Accordingly, by employing the present invention, the inventory required for manufacturing a line of personal computers can be reduced resulting in cost savings.

Brief Description of the Drawings

The foregoing and other objects, features and advantages of the invention will be apparent from the following more particular description of preferred embodiments of the drawings in which like reference characters refer to the same parts throughout the different views. The drawings are not necessarily to scale, emphasis instead being placed upon illustrating the principles of the invention.

FIG. 3 is a top view of the left-hand ejector lever.

FIG. 4 is an elevation view of the left-hand ejector lever.

FIG. 5 is a perspective view of the present invention card guide.

FIG. 6 is a top view of the card guide.

FIG. 7 is an elevation view of the card guide.

FIG. 8 is a top view of the right-hand ejector lever.

FIG. 9 is an elevation view of the right-hand ejector lever.

DETAILED DESCRIPTION OF THE PREFERRED EMBODIMENTS

Figure 1:
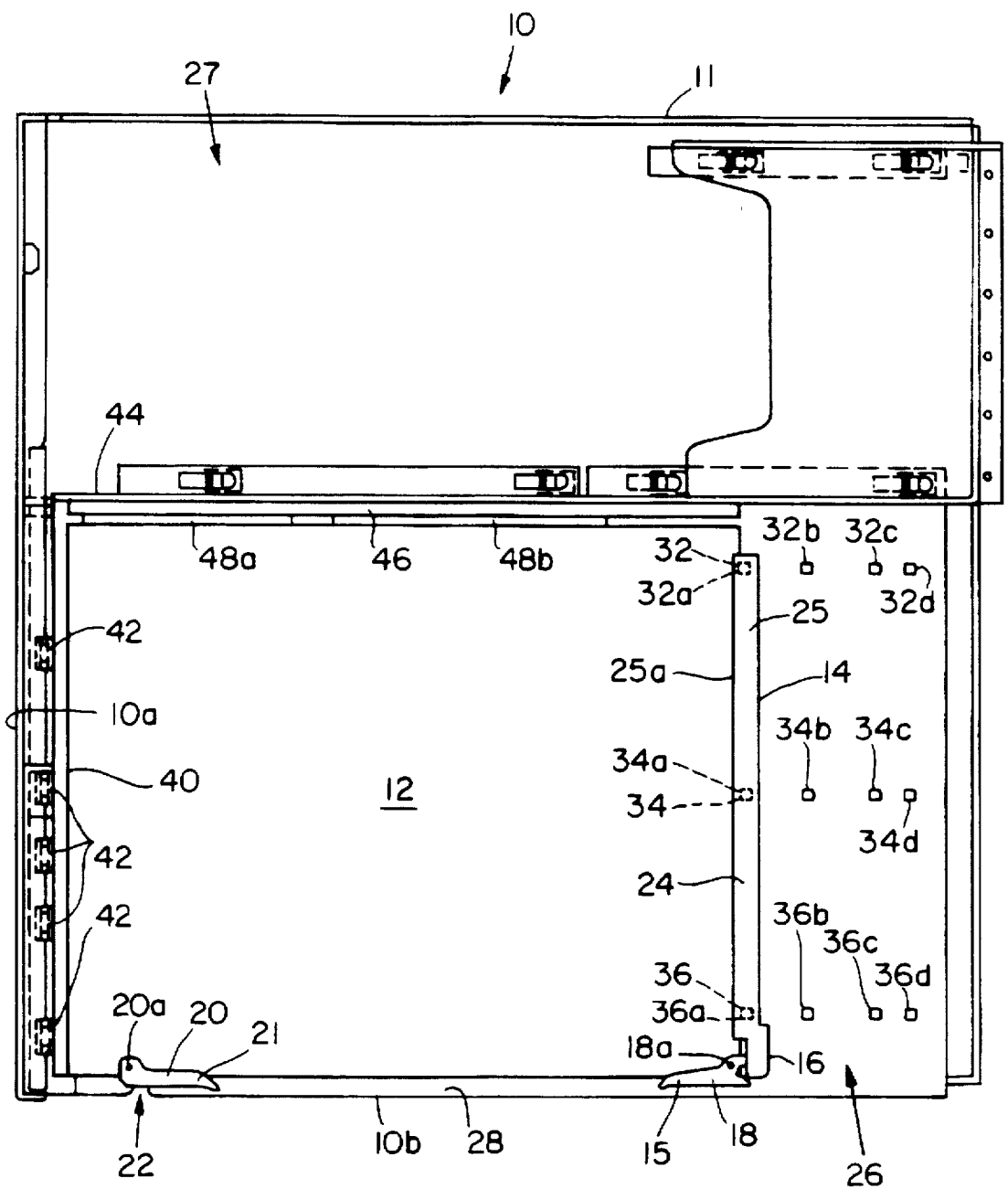
FIG. 1 is a plan view of a motherboard secured within a computer enclosure by the present invention card guide.
Figure 2:
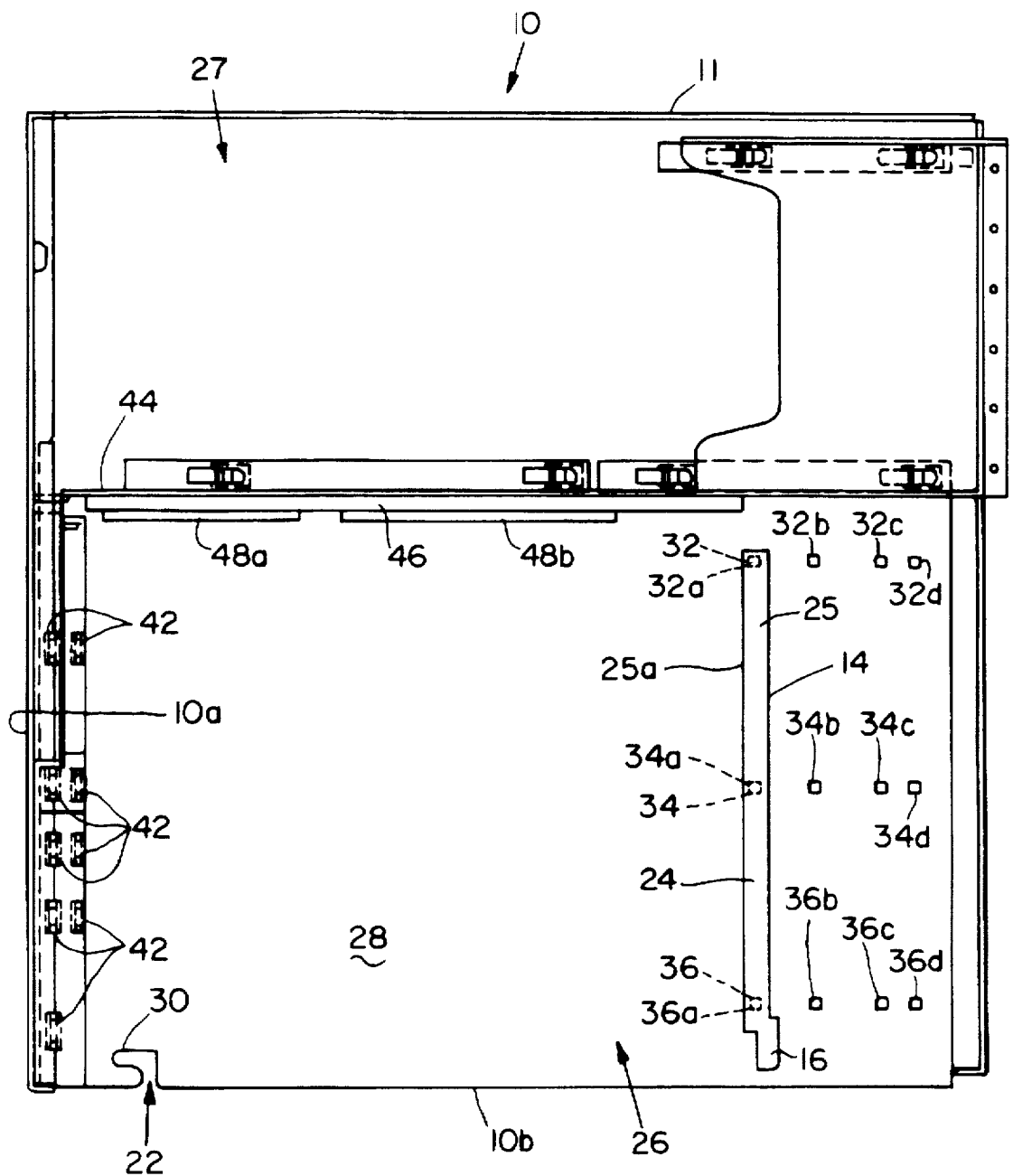
FIG. 2 is a plan view of the enclosure depicted in FIG. 1 with the motherboard omitted.

Referring to FIGS. 1 and 2, personal computer 11 has an enclosure 10 which is partitioned into two regions 26 and 27 by a partition wall 44. The power supply and hard drive is housed within region 27 while the motherboard 12 is housed within region 26. A riser card 46 mounted to partition wall 44 interfaces with the motherboard 12 via connectors 48a and 48b.

In order to properly interface with the riser card 46, the motherboard 12 is guided into region 26 of enclosure 10. The left side of the motherboard 12 is guided by a shield 40 mounted along the left side of the motherboard 12 and the right side of the motherboard 12 is guided by the guide portion 25 of a circuit board retainer 14 which is mounted to the bottom wall 28 of the enclosure 10. A left-hand ejector lever 20 pivotably connected to the rear left side of motherboard 12 engages a slot 22 in the bottom wall 28 of enclosure 10 to secure the left side of the motherboard 12 in place. A right-hand ejector lever 18 pivotably connected to the rear right side of motherboard 12 engages the latching portion 16 of circuit board retainer 14 to secure the right side of the motherboard 12 in place. Securing the motherboard 12 within enclosure 10 prevents the motherboard 12 from disconnecting from the riser card 46.

Shield 40 is mounted along the left side of the motherboard 12 perpendicularly to the motherboard 12. The shield 40 extends across an opening in wall 10a of enclosure 10 and protects the motherboard from the exterior environment. Interface connectors (not shown) from the motherboard 12 extend through the shield 40 to allow interfacing with the motherboard 12. The shield 40 also acts as a guide for sliding motherboard 12 into region 26 during installation. A series of protrusions 42 extend upwardly from the bottom wall 28 in region 26 to form a channel therebetween through which shield 40 is slideably captured.

Left-hand ejector lever 20 is pivotably connected to the rear left-hand side of motherboard 12 about a pivot point 20a. Left-hand ejector lever 20 has a manually operated lever portion 21 and a latching portion 19 which includes a cam 19a (FIGS. 3 and 4) for engaging slot 22 in the bottom wall 28 to lock the left side of motherboard 12 in place. When left-hand ejector lever 20 is pivoted, cam 19a enters slot 22. Further rotation of left-hand ejector lever 20 causes cam 19a to engage portion 30 of slot 22. Portion 30 extends perpendicularly to the entrance of slot 22 thereby preventing cam 19a and the left side of motherboard 12 from moving rearwardly with respect to enclosure 10. The rear of motherboard 12 extends along the side 10b of enclosure 10. The terms left side, right side and rear or rearwardly used in reference to motherboard 12 describe features with respect only to the motherboard 12 and not to enclosure 10.

Referring to FIGS. 5, 6 and 7, circuit board retainer 14 includes an elongate guide portion 25 and a latching portion 16 adjacent to the guide portion 25. An upper rail 24a and a lower rail 24b extend along side 25a of guide portion 25 to form a slot 24 therebetween for capturing and guiding the right-hand edge of motherboard 12. Rails 24a and 24b are thin walled making the rails resilient so that the rails can deflect. This allows the guide portion 25 to guide the right-hand side of the motherboard 12 firmly but not too tightly. For a motherboard about 0.062 inches thick, slot 24 is preferably about 0.075 inches wide, 0.15 inches deep and is located about 0.26 inches above bottom wall 28 when installed. Guide portion 25 is preferably about 8.28 inches long, 0.38 inches wide and 0.41 inches high. Alternatively, the dimensions of slot 24 and guide portion 25 can be varied depending upon dimensional changes of motherboard 12 and enclosure 10 or to vary the mechanical characteristics of circuit board retainer 14.

Resilient protrusions 32, 34 and 36 extend downwardly from the bottom of guide portion 25. Circuit board retainer 14 is mounted to bottom wall 28 by engaging resilient protrusions 32, 34 and 36 with, for example, holes 32a, 34a and 36a in the bottom wall 28. Protrusion 32 has a right angle bend for catching one edge of hole 32a while protrusion 36 includes two opposed resilient wings 37 for engaging both edges of hole 36a. Protrusion 34 engages hole 34a to ensure that circuit board retainer 14 remains straight.

Latching portion 16 includes two recesses 16a and 16b where recess 16a is vertically disposed above recess 16b. Latching portion 16 is about 0.52 inches high, 0.70 inches long, 0.38 inches wide and is offset about 0.19 inches from guide portion 25 to form a recess 38 which provides room for the right-hand edge of motherboard 12 to slide within slot 24. Alternatively, the dimensions of latching portion 16 can be varied depending upon the dimensions of right-hand ejector lever 18.

Right-hand ejector lever 18 is rotatably coupled to the rear right-hand side of motherboard 12 by pivot 18a and engages the latching portion 16 of circuit board retainer 14. Right-hand ejector lever 18 includes a manually operated lever portion 15 and a latching portion 17. Prongs 17a and 17b of latching portion 17 extend from right-hand ejector lever 18 (FIGS. 8 and 9) for engaging recesses 16a and 16b. Prongs 17a and 17b are separated from each other by a recess 13.

Ejector levers 18 and 20 as well as circuit board retainer 14 are preferably made of plastic such as nylon. However, alternatively, other suitable plastics can be used such as polytetrafluoroethylene or delrin. In addition, other suitable materials can be used such as composites or ceramics.

During the installation of motherboard 12, the shield 40 on the left-hand side of motherboard 12 is inserted between the series of protrusions 42 on bottom wall 28 and the right-hand side of motherboard 12 is inserted into slot 24 of circuit board retainer 14. The motherboard 12 is advanced into region 26 of enclosure 10 while being guided on both the right-hand and left-hand sides. The motherboard 12 is thus properly aligned for interfacing with the riser card 46. Right-hand ejector lever 18 is pivoted to engage latching portion 16 and left-hand ejector lever 20 is pivoted to engage slot 22 to lock motherboard 12 firmly in position. In order to remove motherboard 12 from enclosure 10, the ejector levers 18 and 20 are pivoted to disengage latching portion 16 and slot 22 respectively which separates the motherboard 12 from riser card 46. Motherboard 12 can then be manually slid from enclosure 10 for removal.

The series of holes (32a, 34a, 36a), (32b, 34b, 36b), (32c, 34c, 36c) and (32d, 34d, 36d) are positioned on the bottom wall 28 of enclosure 10 in region 26 for allowing the position of circuit board retainer 14 to be adjusted. Holes 32a, 34a, 36a, etc. are small enough to allow four different adjustment positions for circuit board retainer 14 which are relatively close together. As a result, motherboards of different sizes can be installed within a single standard enclosure 10.

In order to change the motherboard 12 in enclosure 10 from a small motherboard to a larger motherboard, motherboard 12 is first removed from enclosure 12 as described above. Protrusions 32, 34, and 36 of circuit board retainer 14 are then disengaged from respective holes 32a, 34a and 36a, thereby allowing circuit board retainer 14 to be removed from bottom wall 28. The protrusions 32, 34 and 36 can then be inserted into another set of holes such as (32b, 34b and 36b), (32c, 34c and 36c) or (32d, 34d and 36d) to relocate and remount circuit board retainer 14 at a different position relative to bottom wall 28 such that a larger motherboard can be installed.

Equivalents

While this invention has been particularly shown and described with references to preferred embodiments thereof, it will be understood by those skilled in the art that various changes in form and details may be made therein without departing from the spirit and scope of the invention as defined by the appended claims. For example, right-hand ejector lever 18 and the latching portion 16 of circuit board retainer 14 can be omitted such that motherboard 12 is locked in place only by ejector lever 20. In such a case, ejector lever 20 can be more centrally located on the motherboard 12 between the left and right sides of the motherboard 12. Additionally, although circuit board retainer 14 is depicted and described for guiding and securing a motherboard in a desktop personal computer, alternatively, circuit board retainer 14 can be employed in a computer tower enclosure as well as employed for guiding and securing other types of circuit boards within a computer enclosure.

What is claimed is:

1. A circuit board retainer for use within an enclosure for guiding and securing a circuit board within the enclosure comprising:

a guide portion having an upper rail and a lower rail extending along an edge of the circuit board retainer forming a slot therebetween for guiding a side of the circuit board; and a latching portion positioned adjacent to the guide portion for engaging an ejector lever pivotably connected to the circuit board, the latching member engaging the ejector lever to effectively lock the circuit board in place relative to the circuit board retainer.

2. The circuit board retainer of claim 1 further comprising a first resilient protrusion extending from the circuit board retainer for engaging a first hole formed in the enclosure to secure the circuit board retainer to the enclosure.

3. The circuit board retainer of claim 2 in which the first hole is formed in a bottom wall of the enclosure so that the circuit board retainer is secured to the bottom wall of the enclosure.

4. The circuit board retainer of claim 3 further comprising a second resilient protrusion extending from the circuit board retainer for engaging a second hole formed in the bottom wall of the enclosure to secure the circuit board retainer to the bottom wall, the first and second holes being included in a first set of holes in the bottom wall of the enclosure.

5. The circuit board retainer of claim 4 in which the first and second resilient protrusions are capable of engaging respective first and second holes of a second set of holes formed in the bottom wall of the enclosure, the second set of holes being spaced apart from the first set of holes so that the position of the circuit board retainer relative to the bottom wall of the enclosure can be adjusted to accommodate different sized circuit boards.

6. The circuit board retainer of claim 1 in which the latching portion includes a recess for engaging a prong extending from the ejector lever.

7. The circuit board retainer of claim 1 in which the latching portion includes two recesses which are vertically disposed relative to each other for engaging two prongs extending from the ejector lever.

8. The circuit board retainer of claim 7 in which the two recesses face in the same direction as the slot.

9. A system for guiding and securing a circuit board within an enclosure comprising:

a circuit board retainer mounted to the enclosure, the circuit board retainer including (a) a guide portion having an upper rail and a lower rail extending along an edge of the circuit board retainer to form a slot therebetween for guiding a first side of the circuit board during insertion and (b) a latching portion positioned adjacent to the guide portion;

a first ejector lever pivotably connected to the circuit board near the first side of the circuit board for engaging the latching portion of the circuit board retainer, the first ejector lever being capable of locking the first side of the circuit board in place relative to the circuit board retainer; and a second ejector lever pivotably connected to the circuit board near a second side of the circuit board for engaging a latching slot formed in the enclosure, the second ejector lever being capable of locking the second side of the circuit board in place relative to the enclosure, the first and second ejector levers securing the circuit board within the enclosure.

10. The system of claim 9 in which the circuit board retainer further comprises a first resilient protrusion extending from the circuit board retainer for engaging a first hole formed in a bottom wall of the enclosure to secure the circuit board retainer to the bottom wall of the enclosure.

11. The system of claim 10 in which the circuit board retainer further comprises a second resilient protrusion extending from the circuit board retainer for engaging a second hole formed in the bottom wall of the enclosure to secure the circuit board retainer to the bottom wall, the first and second holes being included in a first set of holes in the bottom wall of the enclosure.

12. The system of claim 11 in which the first and second resilient protrusions of the circuit board retainer are capable of engaging respective first and second holes of a second set of holes formed in the bottom wall of the enclosure, the second set of holes being spaced apart from the first set of holes so that the position of the circuit board retainer relative to the bottom wall of the enclosure can be adjusted to accommodate different sized circuit boards.

13. The system of claim 9 in which the latching portion includes a recess for engaging a prong extending from the first ejector lever.

14. The system of claim 9 in which the latching portion of the circuit board retainer includes two recesses which are vertically disposed relative to each other for engaging two prongs extending from the first ejector lever.

15. The system of claim 14 in which the two recesses face in the same direction as the slot.

16. A method of guiding and securing a circuit board within an enclosure comprising the steps of:

mounting a circuit board retainer within the enclosure, the circuit board retainer including (a) a guide portion having an upper rail and a lower rail extending along an edge of the circuit board retainer to form a slot therebetween, and (b) a latching portion positioned adjacent to the guide portion;

guiding a side of the circuit board into the enclosure with the slot of the guide portion; and engaging an ejector lever pivotably connected to the circuit board with the latching portion of the circuit board retainer to secure the circuit board within the enclosure.

17. The method of claim 16 in which mounting the circuit board retainer to the enclosure comprises the step of engaging a resilient protrusion extending from the circuit board retainer with a first hole in a bottom wall of the enclosure.

18. The method of claim 17 further comprising the step of remounting the circuit board retainer to a different position relative to bottom wall of the enclosure to accommodate a different sized circuit board, the step of remounting comprising:

removing the resilient protrusion from the first hole;

moving the circuit board retainer to said different position; and engaging the resilient protrusion with a second hole at said different position.

\* \* \* \* \*